(12) United States Patent
Nam et al.

(10) Patent No.: US 9,982,333 B2
(45) Date of Patent: May 29, 2018

(54) MASK FRAME ASSEMBLY AND METHOD OF MANUFACTURING THE SAME

(71) Applicant: Samsung Display Co., Ltd., Yongin, Gyeonggi-Do (KR)

(72) Inventors: Kie Hyun Nam, Yongin (KR); Hye Dong Kim, Yongin (KR); Sung Guk An, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 384 days.

(21) Appl. No.: 14/637,222

(22) Filed: Mar. 3, 2015

(65) Prior Publication Data
US 2015/0368785 A1    Dec. 24, 2015

(30) Foreign Application Priority Data

Jun. 23, 2014    (KR) .................. 10-2014-0076631

(51) Int. Cl.
| | |
|---|---|
| *B32B 38/04* | (2006.01) |
| *G03F 1/64* | (2012.01) |
| *H01L 51/00* | (2006.01) |
| *H01L 27/00* | (2006.01) |
| *C23C 14/04* | (2006.01) |
| *C23C 16/04* | (2006.01) |
| *C23C 14/50* | (2006.01) |
| *B32B 3/26* | (2006.01) |
| *G03F 1/68* | (2012.01) |
| *H01L 27/32* | (2006.01) |
| *G03F 1/50* | (2012.01) |

(Continued)

(52) U.S. Cl.
CPC .......... *C23C 14/042* (2013.01); *C23C 14/50* (2013.01); *B32B 3/266* (2013.01); *B32B 37/025* (2013.01); *B32B 38/10* (2013.01); *C23C 16/042* (2013.01); *G03F 1/14* (2013.01); *G03F 1/16* (2013.01); *G03F 1/50* (2013.01); *G03F 1/60* (2013.01); *G03F 1/64* (2013.01); *G03F 1/68* (2013.01);

(Continued)

(58) Field of Classification Search
CPC ..... G03F 1/14; G03F 1/16; G03F 1/50; G03F 1/60; G03F 1/64; G03F 1/68; B32B 38/10; B32B 37/025; C23C 16/042; H01L 27/3223; H01L 51/56
See application file for complete search history.

(56) References Cited

U.S. PATENT DOCUMENTS

| 8,766,290 B2 | 7/2014 | Lee | |
|---|---|---|---|
| 2004/0104197 A1* | 6/2004 | Shigemura | ............ C23C 14/042 216/20 |

(Continued)

FOREIGN PATENT DOCUMENTS

| JP | 2006-152339 A | 6/2006 |
|---|---|---|
| KR | 10-2003-0027443 A | 4/2003 |

(Continued)

*Primary Examiner* — Linda L Gray
(74) *Attorney, Agent, or Firm* — Knobbe Martens Olson & Bear LLP (57) ABSTRACT

A mask frame assembly for manufacturing a display device, and a method of manufacturing the mask frame assembly are disclosed. In one aspect, the mask frame assembly includes a frame having at least one opening portion defined therein. The mask frame assembly further includes a polymer film having a plurality of slits defined therein and combined to the frame. In another aspect, the method includes coating a polymer solution on a glass and drying and hardening the polymer solution so as to form a polymer film. The method also includes combining a frame to the polymer film, desorbing the glass from the polymer film and processing a plurality of slits on the polymer film.

8 Claims, 9 Drawing Sheets

(51) Int. Cl.
    *H01L 51/56*    (2006.01)
    *G03F 1/00*     (2012.01)
    *B32B 37/00*    (2006.01)
    *G03F 1/60*     (2012.01)
    *B32B 38/10*    (2006.01)

(52) U.S. Cl.
    CPC ....... *H01L 27/3223* (2013.01); *H01L 51/0011* (2013.01); *H01L 51/56* (2013.01)

(56) References Cited

U.S. PATENT DOCUMENTS

| | | |
|---|---|---|
| 2004/0115342 A1* | 6/2004 | Shigemura .......... H01L 51/0004 427/143 |
| 2010/0055810 A1 | 3/2010 | Sung et al. |
| 2012/0145076 A1* | 6/2012 | Shin .......................... G03F 1/00 118/504 |
| 2012/0237679 A1 | 9/2012 | Madigan et al. |
| 2012/0279444 A1* | 11/2012 | Hong .................... C23C 14/042 118/504 |

FOREIGN PATENT DOCUMENTS

| | | |
|---|---|---|
| KR | 10-2005-0120170 A | 12/2005 |
| KR | 10-2010-0026655 A | 3/2010 |
| KR | 10-2012-0014732 A | 2/2012 |
| KR | 10-2012-0073909 A | 7/2012 |
| KR | 10-2013-0060722 A | 6/2013 |
| KR | 10-2013-0138130 A | 12/2013 |
| KR | 10-2014-0007417 A | 1/2014 |

\* cited by examiner

MASK FRAME ASSEMBLY AND METHOD OF MANUFACTURING THE SAME

INCORPORATION BY REFERENCE TO ANY PRIORITY APPLICATIONS

This application claims the benefit of Korean Patent Application No. 10-2014-0076631, filed on Jun. 23, 2014, in the Korean Intellectual Property Office, the disclosure of which is incorporated herein in its entirety by reference.

BACKGROUND

Field

The described technology generally relates to a mask frame assembly and a method of manufacturing the same.

Description of the Related Technology

Of display devices, organic light-emitting diode (OLED) displays have not only a wide viewing angle and an excellent contrast, but also a fast response rate, thereby being noted as next-generation displays.

An OLED display includes an emission layer between a first electrode and a second electrode facing each other, and an intermediate layer including the emission layer. Here, the electrodes and intermediate layer may be formed in various ways, one of which is an independent deposition method. In order to manufacture an OLED display using the independent deposition method, an organic layer of a predetermined pattern is formed on a surface of a substrate where the organic layer and the like are to be formed, by closely adhering fine metal mask (FMM) having the same pattern as that of the organic layer and the like to be formed and depositing a deposition material such as the organic layer, on the surface of the substrate.

SUMMARY OF CERTAIN INVENTIVE ASPECTS

One inventive aspect is a mask frame assembly for manufacturing a display device such as an organic light emitting diode (OLED) display.

Another aspect is a method of manufacturing the mask frame assembly.

Another aspect is a mask frame assembly for depositing a deposition material onto a substrate, and a method of manufacturing the same.

Another aspect is a mask frame assembly which includes a frame having at least one opening portion, and a polymer film having plural slits combined to the frame.

The frame may include a metal.

The mask frame assembly may further include an adhesive layer being interposed between the frame and the polymer film and adhering the frame and the polymer film.

Also, the polymer film may include at least one selected from polyimide, polyphenylene sulfide, polyaryletherketone (PAEK), and liquid crystal polymer.

Also, the polymer film may include a pattern portion, and the slit may be formed on the pattern portion.

Also, the opening portion may be formed in a location corresponding to the pattern portion.

Another aspect is a method of manufacturing the mask frame assembly which includes an operation of coating a polymer solution on a glass, an operation of forming the polymer film by drying and hardening the polymer solution, an operation of combining the frame to the polymer film, an operation of desorbing the glass from the polymer film, and an operation of processing a slit on the polymer film.

The operation of combining the frame to the polymer film may include an operation of coating an adhesive layer on the polymer film, and an operation of combining the frame to the adhesive layer.

The operation of processing the slit on the polymer film may use laser patterning to process the slit. The operation of processing the slit on the polymer film may use light exposure to process the slit.

Another aspect is a mask frame assembly for manufacturing a display device, the mask frame assembly comprising: a frame having at least one opening portion defined therein; and a polymer film having a plurality of slits defined therein and combined to the frame.

In the above mask frame assembly, the frame is formed at least partially of a metal. The above mask frame assembly further comprises an adhesive layer being interposed between the frame and the polymer film and adhering the frame and the polymer film. The above mask frame assembly further comprises an adhesive layer being interposed between the frame and the polymer film and adhering the frame and the polymer film. In the above mask frame assembly, the polymer film comprises one or more of: polyimide, polyphenylene sulfide, polyaryletherketone, and liquid crystal polymer. In the above mask frame assembly, the polymer film comprises a pattern portion and the slits are formed on the pattern portion.

In the above mask frame assembly, the pattern portion comprises a plurality of pattern portions, wherein the at least one opening portion comprises a plurality of opening portions, and wherein the number of the pattern portions is the same as the number of the opening portions. In the above mask frame assembly, the lengths and widths of the opening portions are substantially the same. In the above mask frame assembly, the opening portion is formed in a location corresponding to the pattern portion. In the above mask frame assembly, the opening portion is formed substantially directly below the pattern portion. In the above mask frame assembly, the thickness of the polymer film is in the range from about 10 µm to about 50 µm. In the above mask frame assembly, the polymer film has a coefficient of thermal expansion (CTE) of about 3 ppm/° C. or less.

Another aspect is a method of manufacturing a mask frame assembly for a display device, the method comprising: coating a polymer solution on a glass; drying and hardening the polymer solution so as to form a polymer film; combining a frame to the polymer film; desorbing the glass from the polymer film; and processing a plurality of slits on the polymer film.

In the above method, the combining comprises coating an adhesive layer on the polymer film, and combining the frame to the adhesive layer. In the above method, the processing uses laser patterning and/or light exposure to process the slits. In the above method, the combining is performed while the polymer solution is being dried and hardened. In the above method, the polymer film has a plurality of pattern portions defined therein, wherein the frame has a plurality of opening portions defined therein, and wherein the number of the pattern portions is the same as the number of the opening portions. In the above method, the lengths and widths of the opening portions are substantially the same. In the above method, the combining comprises aligning the frame with the polymer film such that each of the opening portions is formed substantially directly below the corresponding pattern portion. In the above method, the thickness of the polymer film is in the range from about 10 µm to about 50 µm.

DETAILED DESCRIPTION OF CERTAIN INVENTIVE EMBODIMENTS

Reference will now be made in detail to embodiments, examples of which are illustrated in the accompanying drawings, wherein like reference numerals refer to like elements throughout, and thus their repeated description will be omitted.

It will be understood that when a component, such as a layer, a film, a region, or a plate, is referred to herein as being "on" another component, the component can be directly on the other component or intervening components may be present thereon. Also, sizes of components in the drawings may be exaggerated for convenience of explanation. In other words, since sizes and thicknesses of components in the drawings are arbitrarily illustrated for convenience of explanation, the following embodiments are not limited thereto.

Also, when an embodiment may be implemented differently, a process order may be performed differently from the described order. For example, two consecutively described processes may be performed substantially at the same time or performed in an order opposite to the described order. In this disclosure, the term "substantially" includes the meanings of completely, almost completely or to any significant degree under some applications and in accordance with those skilled in the art. Moreover, "formed on" can also mean "formed over." The term "connected" includes an electrical connection.

Figure 1:
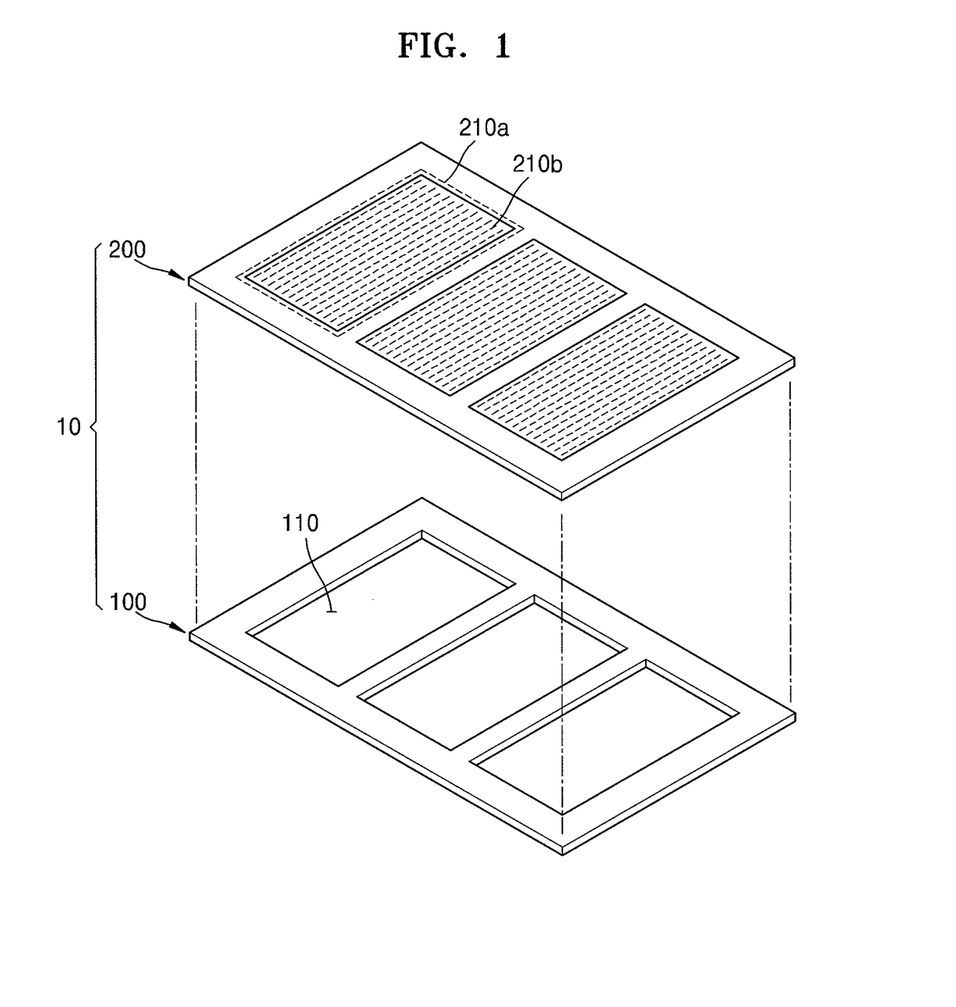
FIG. 1 is a perspective view illustrating a mask frame assembly according to an embodiment.

Embodiments will be described with respect to the accompanying drawings. FIG. 1 is an exploded perspective view illustrating a mask frame assembly according to an embodiment.

First, referring to FIG. 1, the mask frame assembly 10 includes a frame 100 and a polymer film 200.

The frame 100 illustrated in FIG. 1 may be manufactured with a metal and have at least one opening portion 110 in a rectangular form, however, the spirit of an embodiment of which is not limited thereto, and may be formed in various forms, such as a circle or hexagon. The length and widths of the opening portions 110 can be substantially the same.

The polymer film 200 has a pattern portion 210a corresponding to the opening portion 110 of the frame 100, and plural slits 210b are formed on the pattern portion 210a so as to allow a deposition material to pass through the slits in a deposition process.

The polymer film 200 may be formed of polymer materials, such as polyimide (PI), polyphenylene sulfide (PPS), polyaryletherketone (PAEK), or liquid crystal polymer. The above-referenced materials have an excellent thermal resistance, a small change in property from a low temperature to a high temperature, and a strong chemical resistance and abrasion resistance, as high-performance plastic, and may maintain stable performance in poor surroundings. For example, polyimide used to manufacture the polymer film 200 has a coefficient of thermal expansion (CTE) of about 3 ppm/° C. or less, which means that it is possible to perform fine deposition processing even in the temperature of about 500° C. or higher.

In some embodiments, the polymer film 200 is manufactured by coating, drying, and hardening a polymer solution 200a thinly on a glass 50 (see FIGS. 5A through 5D). In a general deposition process, such a polymer film 200 becomes closely attached to a display substrate (not shown) by being pulled by an electrostatic chuck (not shown) with placing the display substrate (not shown) between the polymer film 200 and the electrostatic chuck (not shown).

Here, about 10 μm to about 50 μm is appropriate for the thickness of the polymer film 200. If the polymer film 200 is excessively thinner than needed, when the polymer film 200 becomes closely attached to the display substrate by the electrostatic chuck, the polymer film 200 may be torn or transformed. On the contrary, if the polymer film 200 is excessively thicker than needed, the polymer film 200 fails to become completely closely attached to the display substrate by the weight of the polymer film 200 itself, which causes a shadow phenomenon where a deposition material reaches a region beyond the region that the slit 210b of the polymer film 200 defines in time of deposition, and a thickness distortion phenomenon of a deposition film. Accordingly, the polymer film 200 is formed with an appropriate thickness to provide an optimum deposition process, in other words, if the polymer film 200 is manufactured in the thickness of about 10 to about 50 μm as described above, superfine deposition patterning is possible even on a large-scale substrate without damage, transformation, or sagging. However, depending on embodiments, it is possible that the thickness of the polymer film 200 is less than about 10 μm or greater than about 50 μm.

Hereinafter, a combined structure of the frame 100 and the polymer film 200 will be described with reference to FIG. 2.

Figure 2:
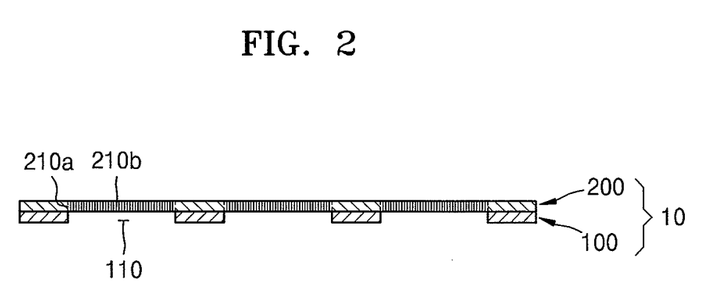
FIG. 2 is a side cross-sectional view of the mask frame assembly of FIG. 1.

FIG. 2 is a side cross-sectional view of the mask frame assembly of FIG. 1.

Referring to FIG. 2, the mask frame assembly 10 is arranged so that the opening portions 110 of the frame 100 correspond to (e.g., located substantially directly below) the pattern portions 210a of the polymer film 200. The frame 100 and the polymer film 200 may be combined in many ways, and the mask frame assembly 10 illustrated in FIG. 2 shows the state where the frame 100 has been combined with the polymer film 200 during the drying and hardening of the polymer film 200.

Figure 3:
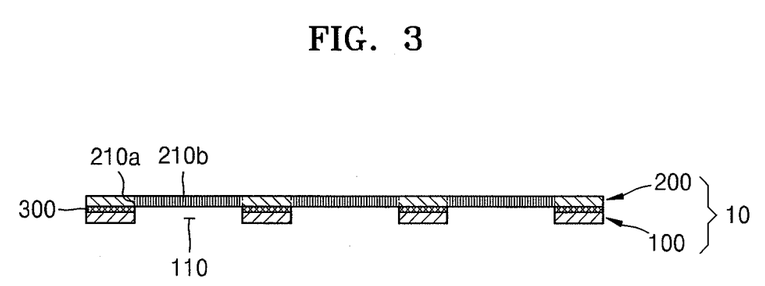
FIG. 3 is a side cross-sectional view of a mask frame assembly according to another embodiment.

FIG. 3 is a side cross-sectional view illustrating a mask frame assembly according to another embodiment.

Referring to FIG. 3, the mask frame assembly 10 illustrates the state where the frame 100 is adhered on the polymer film 200 by further including an adhesive layer 300 between the frame 100 and the polymer film 200. For a material of the adhesive layer 300, silicone may be used.

Generally, as an organic material deposition process is repeatedly performed, an organic material gets accumulated and remains on the mask frame assembly 10. If the organic material deposition process continues to be performed leaving the organic material accumulated on the mask frame assembly 10 as such, the above-referenced shadow phenomenon or the deposition film thickness distortion phenomenon appears. Here, if the frame 100 and the polymer film 200 are combined with silicone, the attachment and detachment of the frame 100 and the polymer film 200 becomes facilitated, therefore, it is possible to perform an efficient organic material deposition process by rapidly attaching or detaching the polymer film 200 to or from the frame 100.

Hereinafter, a method of manufacturing the mask frame assembly 10 according to an embodiment will be described with reference to FIGS. 4, and 5A through 5E. Depending on the embodiment, additional states (operations) can be added, others removed, or the order of the states (operations) changed in FIG. 4.

Figure 4:
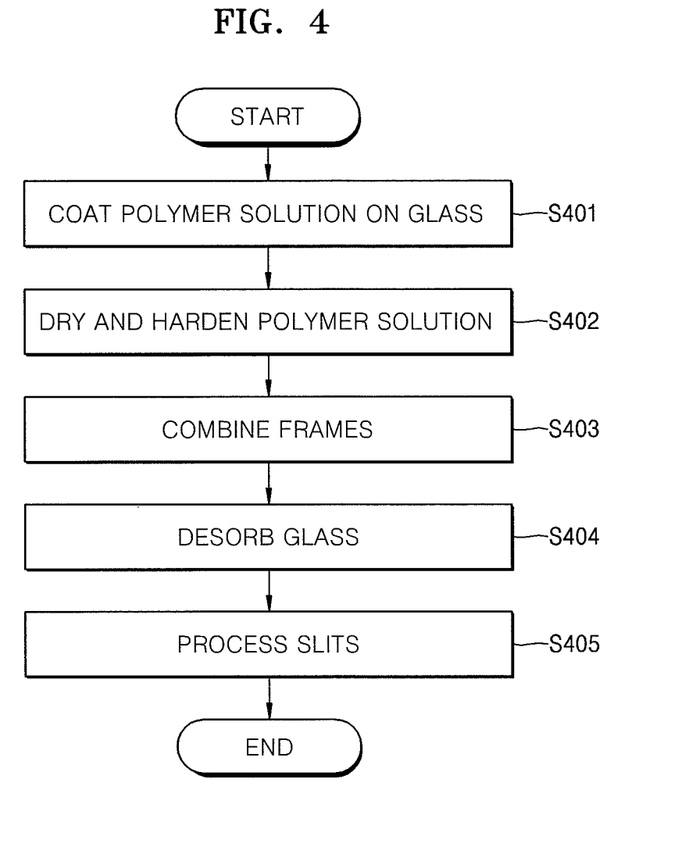
FIG. 4 is a flowchart illustrating a method of manufacturing a mask frame assembly according to an embodiment.

Referring to the flowchart of FIG. 4, the method of manufacturing the mask frame assembly 10 may include coating the polymer solution 200a on the glass 50 in operation S401, drying and hardening the polymer solution 200a in operation S402, combining the frame 100 to the polymer film 200 in operation S403, desorbing the glass 50 in operation S404, and processing a plurality of slits 210b on the pattern portions 210a of the polymer film 200 in operation S405.

In coating the polymer solution 200a in operation S401, polymer materials, such as PI, PPS, PEEK, or liquid crystal polymer as recited above may be used as the material of the polymer solution 200a.

Figure 5A:
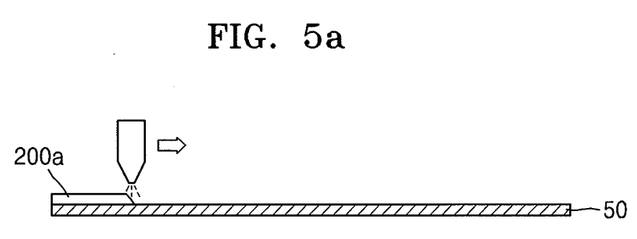
FIG. 5A is a view illustrating an operation of coating a polymer solution on a glass.
Figure 5B:
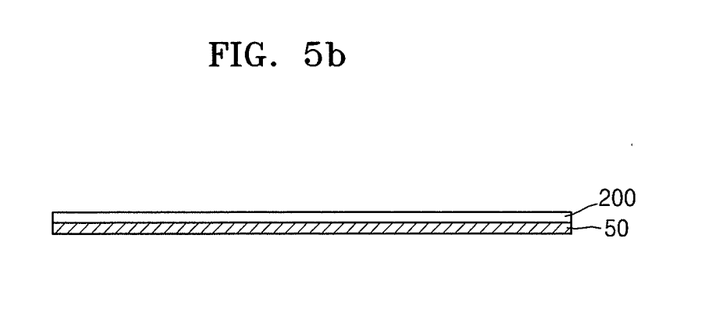
FIG. 5B is a view illustrating an operation of forming a polymer film by drying and hardening the polymer solution.

If the coating of the polymer solution 200a on the glass 50 in operation S401 (see FIG. 5A) is followed by the drying and hardening of the polymer solution 200a in operation S402, the polymer film 200 is formed on the glass 50 (see FIG. 5B).

The frame 100 and the polymer film 200 can be combined in two ways.

Figure 5C:
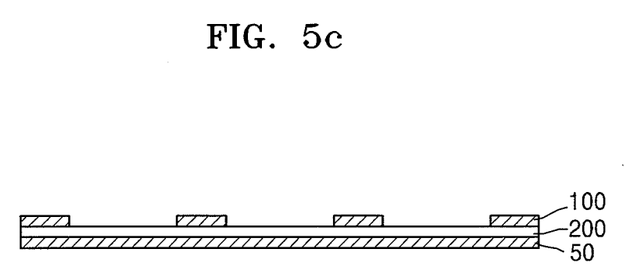
FIG. 5C is a view illustrating an operation of combining a frame with the polymer film.
Figure 5D:
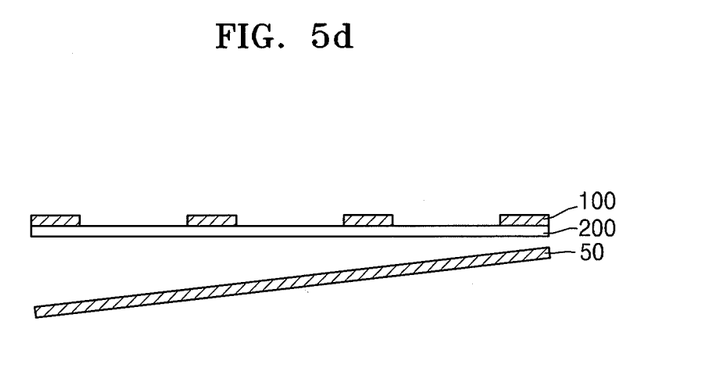
FIG. 5D is a view illustrating an operation of desorbing the glass from the polymer film.

First, the frame 100 may be combined to the polymer solution 200a before the polymer solution 200a becomes substantially completely dried, and FIG. 5C is a view illustrating the form of the frame 100 and the polymer film 200 combined as such.

Otherwise, after the polymer solution 200a coated on the frame 100 becomes substantially completely dried and hardened and turns into the polymer film 200, as illustrated in FIG. 3, the frame 100 and the polymer film 200 may be combined by coating the adhesive layer 300 on the polymer film 200 and then combining the frame 100 to the adhesive layer 300. Silicone may be used as the material of such an adhesive layer 300, which has been described above, and therefore, detailed explanations thereof are omitted herein.

After the frame 100 and the polymer film 200 are combined to each other as such, it is prepared to form the slits 210b on the pattern portions 210a of the polymer film 200 by desorbing the glass 50 in operation S404.

Figure 5E:
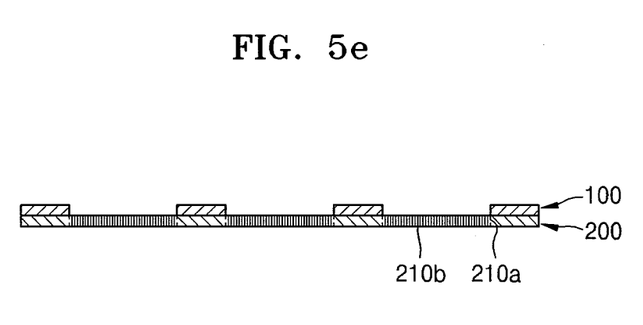
FIG. 5E is a drawing illustrating an operation of processing slits on the polymer film.

Finally, after the glass 50 is desorbed, the slits 210b are formed on the polymer film 200 in operation S405. Here, the slits 210b of the polymer film 200 may be formed in various ways, but it is preferable to form the slits 210b by a laser patterning method or a light exposure method.

As described above, according to at least one of the above embodiments, the mask frame assembly and the method of manufacturing the same enables superfine deposition patterning and has the effect of improving the deposition film thickness distortion phenomenon by the sagging of a substrate or a mask. The mask frame assembly can be used to deposit deposition materials to a display substrate to manufacture a display device such as OLEDs.

While the inventive technology has been described with reference to the figures, it will be understood by those of ordinary skill in the art that various changes in form and details may be made therein without departing from the spirit and scope of the present invention as defined by the following claims.

What is claimed is:

1. A method of manufacturing a mask frame assembly for a display device, the method comprising:
   coating a polymer solution on a glass;
   drying and hardening the polymer solution so as to form a polymer film;
   combining a frame to the polymer film;
   desorbing the glass from the polymer film; and
   processing a plurality of slits on the polymer film.

2. The method of claim 1, wherein the combining comprises coating an adhesive layer on the polymer film, and combining the frame to the adhesive layer.

3. The method of claim 1, wherein the processing uses laser patterning and/or light exposure to process the slits.

4. The method of claim 1, wherein the polymer film is formed before the polymer solution is completely dried and hardened, and wherein the polymer film is combined to the frame while the polymer solution is being dried and hardened.

5. The method of claim 1, wherein the polymer film has a plurality of pattern portions defined therein, wherein the frame has a plurality of opening portions defined therein, and wherein the number of the pattern portions is the same as the number of the opening portions.

6. The method of claim 5, wherein the lengths and widths of the opening portions are substantially the same.

7. The method of claim 5, wherein the combining comprises aligning the frame with the polymer film such that each of the opening portions is formed substantially directly below the corresponding pattern portion.

8. The method of claim 1, wherein the thickness of the polymer film is in the range from about 10 µm to about 50 µm.

* * * * *